(12) United States Patent
Dong et al.

(10) Patent No.: US 9,838,031 B2
(45) Date of Patent: Dec. 5, 2017

(54) DITHER INJECTION FOR CONTINUOUS-TIME MASH ADCS

(71) Applicant: Analog Devices Global

(72) Inventors: Yunzhi Dong, Weehawkin, NJ (US); Hajime Shibata, Toronto (CA); Trevor Clifford Caldwell, Toronto (CA); Zhao Li, North York (CA); Jialin Zhao, Santa Clara (CA); Jose Barreiro Silva, Bedford, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/360,984

(22) Filed: Nov. 23, 2016

(65) Prior Publication Data
US 2017/0179975 A1 Jun. 22, 2017

Related U.S. Application Data

(60) Provisional application No. 62/268,034, filed on Dec. 16, 2015.

(51) Int. Cl.
*H03M 3/00* (2006.01)
*H03M 1/36* (2006.01)

(52) U.S. Cl.
CPC ......... *H03M 3/422* (2013.01); *H03M 3/322* (2013.01); *H03M 3/388* (2013.01); *H03M 3/436* (2013.01); *H03M 3/464* (2013.01); *H03M 1/361* (2013.01); *H03M 3/344* (2013.01); *H03M 3/378* (2013.01); *H03M 3/414* (2013.01)

(58) Field of Classification Search
CPC ....... H03M 3/422; H03M 3/322; H03M 3/436
USPC ................ 341/118, 120, 155, 144, 143, 122
See application file for complete search history.

(56) References Cited

U.S. PATENT DOCUMENTS

| 4,862,169 A | 8/1989 | van Bavel |
| 5,959,562 A | 9/1999 | Wiesbauer |
| 6,275,177 B1 | 8/2001 | Ho |

(Continued)

FOREIGN PATENT DOCUMENTS

| CN | 101330482 | 7/2012 |
| EP | 2930850 | 3/2015 |

OTHER PUBLICATIONS

Notice of Allowance (1st Action) issued in U.S. Appl. No. 15/359,240 dated Feb. 2, 2017, 9 pages.

(Continued)

*Primary Examiner* — Peguy Jean Pierre
(74) *Attorney, Agent, or Firm* — Patent Capital Group

(57) ABSTRACT

For continuous-time multi-stage noise shaping analog to digital converters (CT MASH ADCs), quantization noise cancellation often requires estimation of transfer functions, e.g., a noise transfer function of the front end modulator. To estimate the noise transfer function, a dither signal can be injected in the front end modulator. However, it is not trivial how the dither signal can be injected, since the dither signal can potentially leak to the back end modulator and cause overall noise degradation. To address some of these issues, the dither signal is injected post the flash analog to digital converter (ADC) of the front end modulator. Furthermore, dummy comparator structures can be used to synchronize the dither with the quantization noise of the targeted flash ADC.

20 Claims, 12 Drawing Sheets

(56) References Cited

U.S. PATENT DOCUMENTS

| | | | |
|---|---|---|---|
| 6,473,019 | B1 | 10/2002 | Ruha |
| 6,518,904 | B1 | 2/2003 | Jelonnek |
| 6,873,281 | B1 | 3/2005 | Esterberg et al. |
| 6,965,275 | B2 | 11/2005 | De Giandomenico et al. |
| 6,970,120 | B1 | 11/2005 | Bjornsen |
| 6,980,145 | B1* | 12/2005 | Tammineedi ........... H03M 3/33 341/131 |
| 7,042,375 | B1 | 5/2006 | van Engelen |
| 7,321,325 | B2 | 1/2008 | Hsieh et al. |
| 7,385,537 | B2 | 6/2008 | Yang et al. |
| 7,548,071 | B2 | 6/2009 | Harrison et al. |
| 7,626,525 | B2 | 12/2009 | Zhou |
| 2006/0195776 | A1* | 8/2006 | Yang ....................... H04L 1/244 714/823 |
| 2007/0090980 | A1* | 4/2007 | Lin .......................... H03M 3/33 341/143 |
| 2011/0163900 | A1 | 7/2011 | Pagnanelli |
| 2013/0194114 | A1* | 8/2013 | Ritter .................... H03M 3/368 341/110 |
| 2015/0288379 | A1 | 10/2015 | Silva et al. |

OTHER PUBLICATIONS

Muhammed Bolatkale et al., *A 4GHz CT ΔΣ ADC with 70dB DR and -74dBFS THD in 125MHz BW*, ISSCC 2011 / Session 27 / Oversampling Converters / 27.1, 2011 IEEE International Solid-State Circuits Conference, 978-1-61284-302-5/11 © 2011 IEEE, 3 pages.

Hajime Shibata et al., *A DC-to-1 GHz Tunable RF ΔΣ ADC Achieving DR= 74 dB and BW= 150 MHz at f0 = 450 MHz Using 550 mW*, © 2012 IEEE, 10 pages.

Yunzhi Dong et al., *A 235mW CT 0-3 MASH ADC Achieving -167dBFS/Hz NSD with 53MHz BW*, ISSCC 2014 / Session 29 / Data Converters for Wireless Systems / 29.2, © 2014 IEEE International Solid-State Circuits Conference, 3 pages.

Do-Yeon Yoon et al., *An 85dB-DR 74.6dB-SNDR 50MHz-BW CT MASH ΔΣ Modulator in 28nm CMOS*, ISSCC 2015 / Session 15 / Data-Converter Techniques / 15.1, 2015 IEEE International Solid State Circuits Conference © 2015 IEEE, 3 pages.

Péter Kiss et al., *Adaptive Digital Correction of Analog Errors in MASH ADCs—Part II. Correction Using Test-Signal Injection*, IEEE Transactions on Circuits and Systems—II: Analog and Digital Signal Processing, vol. 47, No. 7, Jul. 2000, 9 pages.

Victor Rodolfo Gonzalez-Diaz et al., *Efficient Dithering in MASH Sigma-Delta Modulators for Fractional Frequency Synthesizers*, article found in Circuits and Systems I: Regular Papers, IEEE Transactions on Oct. 2010, 11 pages.

Do-Yeon Yoon et al., *A Continuous-Time Sturdy MASH ΔΣ Modulator in 28 nm CMOS*, IEEE Journal of Solid-State Circuits, vol. 50, No. 12, Dec. 2015, 11 pages.

Do-Yeon Yoon, *A Continuous-Time Multi-Stage Noise Shaping Delta-Sigma Modulator for Next Generation Wireless Applications*, Jun. 2015 © Massachusetts Institute of Technology, 61 pages.

Yunzhi Dong et al., A Continuous-Time 0-3 MASH ADC Achieving 88 dB Dr with 53 MHz BW in 28 nm CMOS, IEEE Journal of Solid-State Circuits, vol. 29, No. 12, Dec. 2014, 10 pages.

Gert Cauwengerghs et al., *Adaptive Digital Correction of Analog Errors in MASH ADC's—Part I: Off-Line and Blind On-Line Calibration*, IEEE Transactions on Circuits and Systems—II: Analog and Digital Signal Processing, vol. 47, No. 7, Jul. 2000, 8 pages.

J. Silva et al., *Digital Techniques for Improved ΔΣ Data Conversion*, IEEE Custom Integrated Circuits Conference © 2000, 8 pages.

Péter Kiss, *Adaptive Digital Compensation of Analog Circuit Imperfections for Cascaded Delta-Sigma Analog-to-Digital Converters*, Center for Design of Analog-Digital Integrated Circuits, Aug. 20, 1999, Oregon State University, 123 pages.

Yun-Shiang Shu et al., *LMS-Based Noise Leakage Calibration of Cascaded Continuous-Time ΔΣ Modulators*, IEEE Journal of Solid-State Circuits, vol. 45, No. 2, Feb. 2010, 12 pages.

Romuald Mazurek et al., *Application of Maximum-Length Sequences to Impulse Response Measurement of Hydroacoustic Communications Systems*, Gdańsk University of Technology, Gdańsk, Poland, 8 pages.

EP Search Report issued in EP Patent Application Serial No. 16201799.0 dated Apr. 11, 2017, 12 pages.

European Search Report issued in EP Patent Application Serial No. 16202962.3 dated May 12, 2017, 12 pages.

Notice of Allowance (1st Action) issued in U.S. Appl. No. 15/365,867 dated May 10, 2017, 12 pages.

Extended EP Search Report issued in EP Patent Application Serial No. 16201799.0 dated May 12, 2017, 10 pages.

Sudharsan Kanagaraj et al., *An Online Fully-digital Calibration of Leakage Noise in MASH Continuous Time ΔΣ modulators*, ©2011 IEEE, 978-1-4244-9474-3/11, 4 pages.

Bahar Jalali-Farahani et al., *Adaptive Noise Cancellation Techniques in Sigma-Delta Analog-to-Digital Converters*, © 2007 IEEE, 1549-8328, 10 pages.

A. Klein, *Chapter 2, Linear Feedback Shift Registers*, © 2013 Springer-Verlag, London 2013, 10.1007/978-1-4471-5079-4, 44 pages.

Bernard Widrow et al., *Adaptive Noise Cancelling: Principles and Applications*, Mar. 24, 1975, 26 pages.

\* cited by examiner

DITHER INJECTION FOR CONTINUOUS-TIME MASH ADCS

PRIORITY DATA

This is a non-provisional patent application receiving benefit from US Provisional Patent Application, entitled, DITHER INJECTION FOR CONTINUOUS-TIME MASH ADCS (filed on Dec. 16, 2015, Ser. No. 62/268,034). The US Provisional Patent Application is hereby incorporated by reference in its entirety.

TECHNICAL FIELD OF THE DISCLOSURE

The present disclosure relates generally to analog to digital converters (ADCs) and, more particularly, to dither injection techniques for multi-stage noise shaping analog to digital converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADDs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

For continuous-time multi-stage noise shaping analog to digital converters (CT MASH ADCs), quantization noise cancellation often requires estimation of transfer functions, e.g., a noise transfer function of the front end modulator. To estimate the noise transfer function, a dither signal can be injected in the front end modulator. However, it is not trivial how the dither signal can be injected, since the dither signal can potentially leak to the back-end modulator and cause overall noise degradation. To address some of these issues, the dither signal is injected post the flash analog to digital converter (ADC) of the front end modulator. Furthermore, dummy comparator structures can be used to synchronize the dither with the quantization noise of the targeted flash ADC.

Design Considerations of Analog to Digital Converters (ADCs)

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
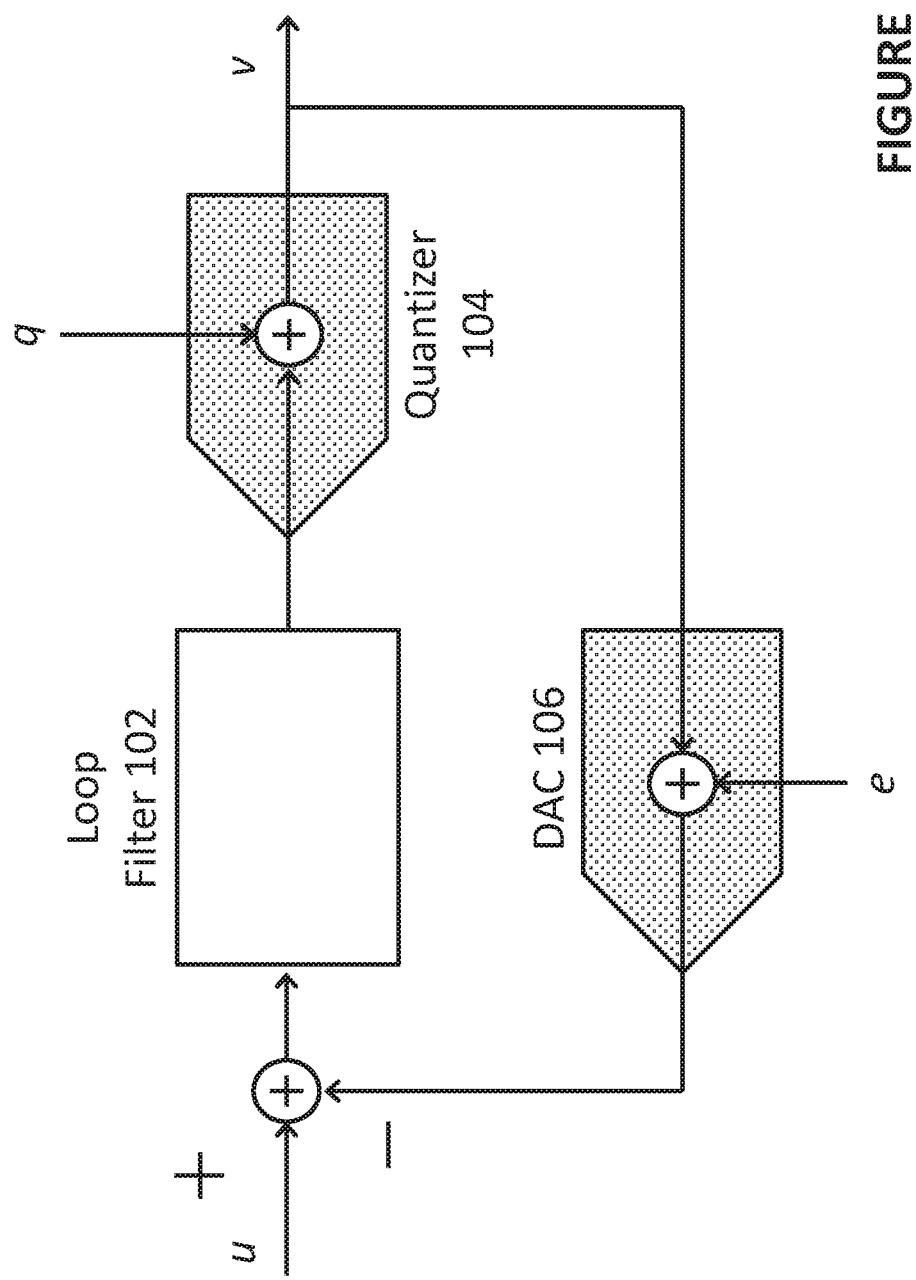
FIG. 1 is an illustrative system diagram of a delta sigma analog to digital converter (DS ADC)

ADCs based on delta-sigma (DS) modulation (referred to herein as "DS ADCs") have been widely used in digital audio and high precision instrumentation systems. FIG. 1 is an illustrative system diagram of a delta sigma analog to digital converter (DS ADC), or sometimes referred herein as a delta sigma modulator. The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, is included to provide error feedback for the DS ADC and to help shape the noise from the quantizer 104 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog to digital conversion. Due to its popularity, many variations on the DS ADC and structures employing the DS ADC have been proposed.

The feedback DAC 106 is typically in a feedback configuration with an analog to digital converter (ADC). That is, the digital output of the ADC "v" is fed to the input of the feedback DAC 106, and the output of the feedback DAC is fed back to the input path of the ADC. Generally speaking, the feedback DAC 106 is a multi-bit DAC which is implemented with a plurality of unit elements that are controlled by input bits to the feedback DAC. Each one of the unit elements, e.g., current steering cells, generate from the input digital code v fed to the feedback DAC 106 a part of analog output signal of the feedback DAC. In some cases, these unit elements are referred to as DAC elements which make up the feedback DAC 106. The DAC elements are, in some cases, referred to as unit elements because to the current steering circuits are ideally steering the same amount of current to the output (i.e., the DAC elements are weighted the same or have the same weight).

Different variations on the DS ADC have been proposed to achieve various advantages suitable for a variety of systems. In some applications, DS ADCs have been adapted to meet power concerns, while some other DS ADCs have been adapted to reduce complexity. In some cases, DS ADCs have been adapted to meet precision concerns by providing increased control over errors and/or noise. For example, for applications with an emphasis on noise shaping, a higher order DS modulator may be used, i.e., more integrators and feedback paths are used in the loop filter for shaping even more of the quantization noise to high frequencies. Delta-sigma ADCs (e.g., FIG. 1) use the shaping of quantization noise combined with oversampling to trade off resolution with signal bandwidth. High-order noise shaping and multi-bit implementations allow for more aggressive tradeoffs, but at the risk of making the ADC unstable.

Multi-stage noise shaping (MASH) ADCs having multiple DS ADCs have been introduced. Generally speaking, MASH ADCs has a plurality of stages, e.g., a plurality of DS ADCs. In one example, a MASH ADC can have two stages, e.g., a front end and a back end. Each of the stages receive a respective analog input and outputs a respective digital output. In some cases, the stages receive the same analog output. In some cases, the stages receive different analog inputs. For instance, some MASH ADCs have a front-end and a back-end where inputs to each modulator differ. Some MASH ADCs have stages where the implementation of the stage may differ. MASH ADCs address the issue of unstability by relying on the cascading of individually stable delta-sigma modulators. However, MASH ADCs rely on the cancellation of quantization noise, which requires accurate matching between analog and digital transfer functions.

Generally speaking, MASH ADCs can include a plurality of stages (cascaded delta sigma modulators) for digitizing the signal and errors of the system in order to meet design requirements related to bandwidth, resolution, and the signal to noise ratios. One advantage of MASH ADCs is that the design cascades stable low-order loops while achieving the good performance of (potentially unstable) higher-order loops. In one example, the first stage generates, from the analog input signal, a digital output signal using a first ADC. The input to the quantizer in the first stage (or equivalently, the output from the first loop filter/integrator) can be subtracted from the first DAC analog output to yield the first stage quantization noise. The first stage quantization noise is digitized by the second stage. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input to the quantizer in the second stage (or equivalently, the output from the second loop filter or integrator) can be subtracted from the second DAC analog output to yield the second stage quantization noise which can be in turn quantized by a third stage. Input to the quantizer or output from the loop filter/integrator may be delayed by a delay element prior to the subtraction. The delay element can be provided match possible transconductance and group delay of a signal path used for generating the DAC analog output from the analog signal at the input of the delay element. To generate the final output of the MASH ADC, the respective outputs are combined. Effectively, the result is that the quantization noise of the first stage is suppressed by the second stage, and the quantization noise from the second stage is suppressed by the third stage (yielding the same suppression of noise as a single third-order loop, when three cascaded first-order loops are used).

Figure 2:
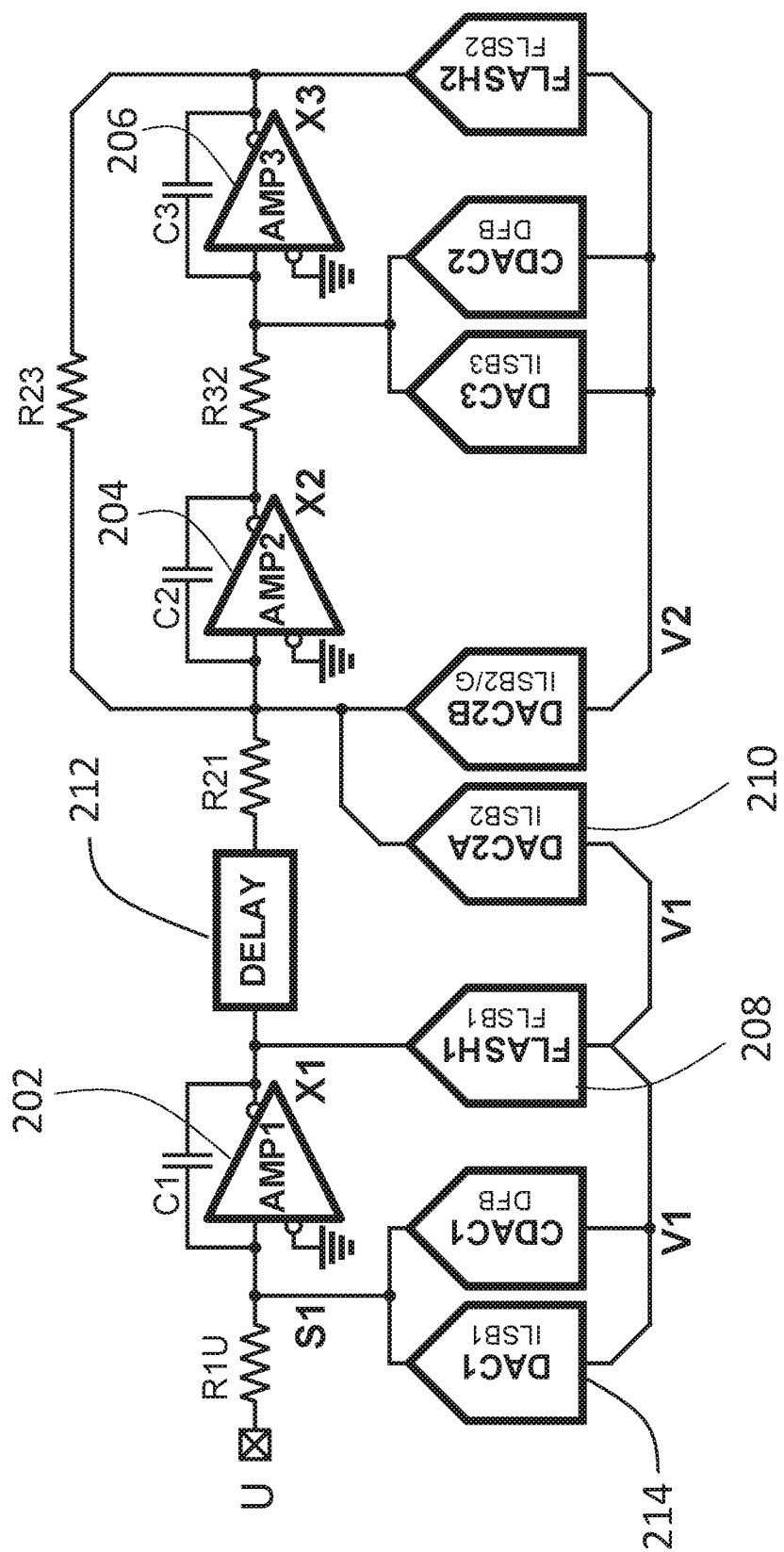
FIG. 2 is an illustrative system diagram of a 1-2 continuous time multi-stage noise shaping delta sigma analog to digital converter (CT MASH ADC), according to some embodiments of the disclosure.

FIG. 2 is an illustrative system diagram of a 1-2 continuous time multi-stage delta sigma analog to digital converter (CT MASH ADC), according to some embodiments of the disclosure. In this example, the CT MASH ADC has two stages: a first order delta sigma modulator as the first stage (or front end, referred herein as $MOD_A$), and a second order delta sigma modulator as the second stage (or back end). The first stage (or front end) generates a first digital output V1. The second stage (or back end) generates a second digital output V2. The order of the delta sigma modulator is determined by the number of integrators (number of feedback loops) in the stage. The first stage (front end) has only one integrator (e.g., integrator having opamp AMP1 202 generating output signal X1), thus it is a first order modulator. The second stage (back end, referred herein as $MOD_B$)

has two integrators (e.g., integrator having amplifier opamp AMP2 204 generating output X2, and integrator having opamp AMP3 206 generating output X3), thus it is a second order modulator. While this example is a 1-2 CT MASH ADC, the present disclosure is applicable to a variety of converters having the feedback DAC, including other CT MASH ADC architectures, discrete time (DT) MASH ADC architectures, hybrid CT-DT MASH ADC architectures, and CT, DT, or hybrid CT-DT pipeline modulators, successive approximation register (SAR) ADC architectures, and other ADC architectures having a feedback DAC whose errors affect the overall performance of the converter.

Referring back to FIG. 2, the residue of the coarse quantization provided by the flash quantizer ("FLASH1" 208) inside the first order front end is fed to the second order back end and gets digitized by the second order back end. The output of the integrator in the first order front end (or input to the flash quantizer FLASH1 208), X1, is digitized by FLASH1 208 to generate digital output V1. Digital output V1 is provided as input to DAC "DAC2A" 210 to generate an analog output signal. The difference between X1 (or a delayed version of X1 at the output of the delay block 212) and the DAC2A 210 analog output yields the residue of the coarse quantization. The delay element 212 is provided to match the transconductance and the group delay of the signal path used for generating the DAC2A 210 analog output, i.e., the path through FLASH1 208 and DAC2A 210. The digital output of the front end V1 and the digital output of the back end V2 are properly combined in digital domain as the final digital word of the 1-2 CT MASH ADC.

Quantization Noise Cancellation

Figure 3:
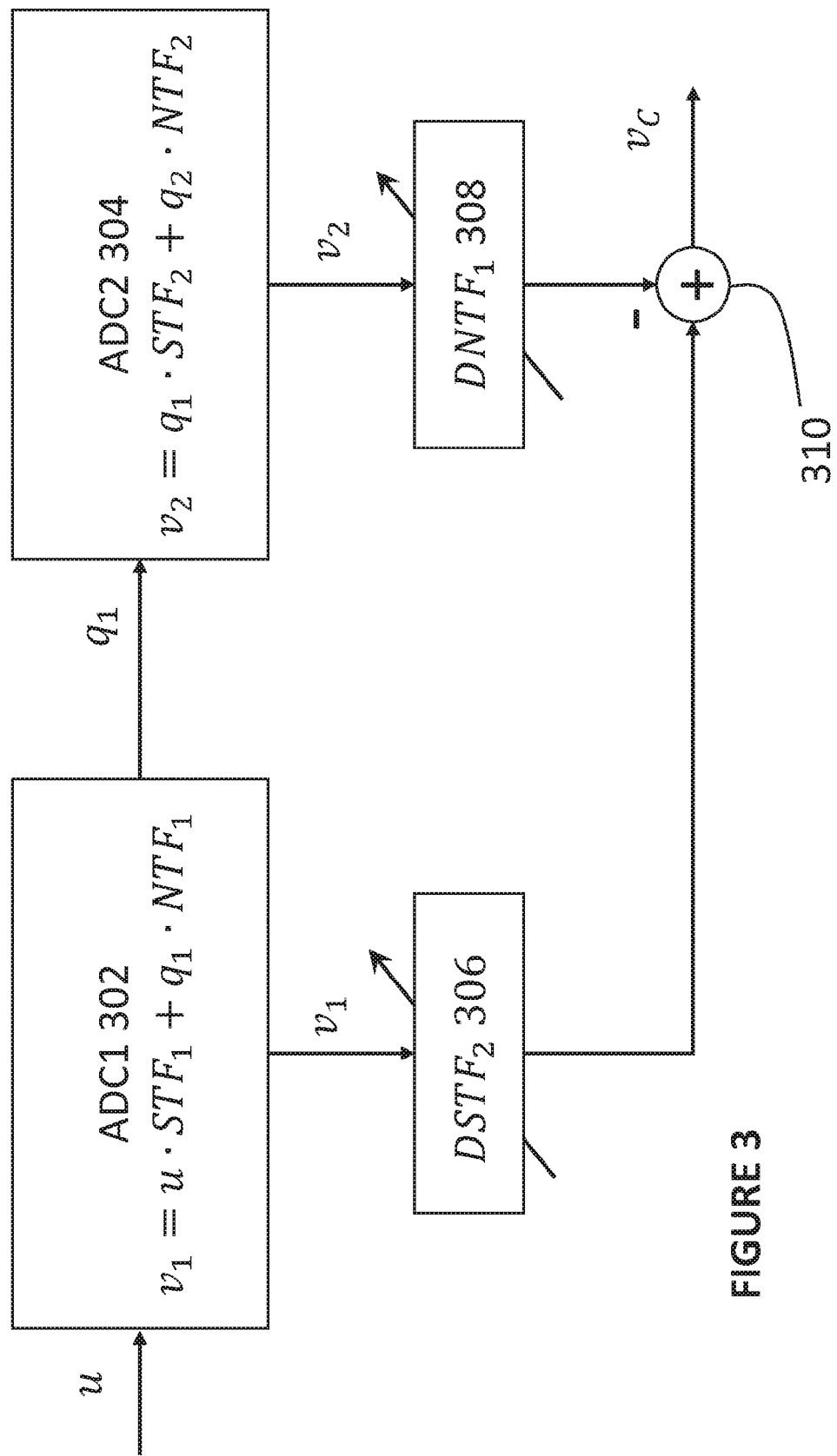
FIG. 3 shows (a high level diagram of) an exemplary two-stage MASH ADC with digital quantization noise cancellation, according to some embodiments of the disclosure.

While providing multiple stages increases complexity and cost, MASH ADCs can achieve remarkable performance, if the cancellation of quantization noise can be properly performed. FIG. 3 shows (a high level diagram of) an exemplary two-stage MASH ADC with digital quantization noise cancellation, which can provide cancellation of quantization noise. While the example shows two stages, it is envisioned by the disclosure that digital quantization noise cancellation can be applied to MASH ADCs with more than two stages. Two ADCs, ADC1 302 (of front end, or $MOD_A$), and ADC2 304 (back end or $MOD_B$), are arranged in cascade, representing the ADCs in two separate stages. Each ADC has a signal transfer function (STF), $STF_1$ and $STF_2$, from its input to its output. The quantization noise q introduced by ADC1 302 appears at its output. $q_1 = u - v_1$ is the quantization noise of ADC1 302; $q_2$ is the quantization noise of ADC2 304. The quantization noise is shaped by a noise transfer function (NTF) of the same stage. For instance, the quantization noise of the first stage $q_1$ is shaped by the noise transfer function of the first stage $NTF_1$. The quantization noise of the second stage $q_2$ is shaped by the noise transfer function of the second stage $NTF_2$. The transfer functions denoted by $DSTF_2$ 306 and $DNTF_1$ 308 correspond to digital implementations or estimations of their corresponding analog counterparts, $STF_2$ and $NTF_1$. $DSTF_2$ and $DNTF_1$ are discrete-time transfer functions or equivalent discrete-time representations of continuous-time transfer functions. After the digital outputs v1, v2 of the two-stages are filtered by the DSTF2 306 and DNTF1 308 respectively, the digital signals are combined, e.g., by summing node 310 (or some other suitable summing circuit or adder), to generate a final digital output vc.

For the two-stage MASH ADC of FIG. 2, the combined output $v_c$ is given as:

$$vc = v_1 DSTF_2 - v_2 DNTF_1 \quad (1)$$
$$= uSTF_1 DSTF_2 + q_1(NTF_1 DSTF_2 - STF_2 DNTF_1) - q_2 NTF_2 DNTF_1$$

If the analog and digital transfer functions are made to match perfectly, i.e., if $DSTF_2 = STF_2$ and $DNTF_1 = NTF_1$ the above expression simplifies to:

$$vc = uSTF_1 DSTF_2 - q_2 NTF_2 DNTF_1 \quad (2)$$

Therefore, the quantization noise from the first stage $q_1$ is cancelled out (no longer appears in the combined output $v_c$) by means of providing the digital filters $DSTF_2$ 206 and $DNTF_1$ 208 filtering the digital outputs $v_1$, $v_2$ of the two-stages respectively. The quantization noise from the second stage $q_2$ is shaped by the product of the two noise transfer functions (i.e., $NTF_2 DNTF_1$). If the analog and digital transfer functions do not match, the quantization noise from the first stage would appear at the combined output shaped by the $(NTF_1 DSTF_2 - STF_2 DNTF_1)$ term. This undesirable effect is called quantization noise leakage, and can significantly degrade the achievable Signal-to-Noise Ratio (SNR) performance of the ADC.

Various techniques have been explored to reduce quantization noise leakage. In some cases, the analog transfer functions can be made as accurate and predictable as possible, but this approach is only possible for certain low speed implementations using switched-capacitor circuits (discrete time implementations). A more effective technique is to design lower-performance analog circuits, estimate what their real/actual signal and noise transfer functions are, and compensate for their shortcomings with programmable digital filters (as shown by the arrows for $DSTF_2$ 306 and $DNTF_1$ 308 filters of FIG. 3). This technique works well as long as the analog circuits are sufficiently linear and are time invariant. The estimation of transfer function impulse responses may be performed in the background by cross-correlating the ADC outputs with a known random signal injected at the quantizer of the first stage, or in the foreground by injecting known signals. The programmable digital filters or cancellation filters can be implemented as programmable finite-impulse response (FIR) filters.

Problems of Some Dither Injection Techniques

As illustrated by FIG. 3, removing the quantization noise in a CT MASH ADC involves extracting the quantization error of a flash quantizer (ADC) inside a CT modulator $MOD_A$ (e.g., the front end modulator), measuring it with another CT modulator $MOD_B$ (e.g., the back end modulator), and then subtracting this quantization error from the output of $MOD_A$. To perform such operation, a digital cancellation filter $DNTF_1$ 308 is implemented by estimating the noise transfer function (NTF) of $MOD_A$ (this is referred to in FIG. 3 as $NTF_1$). Estimation of the noise transfer function can be performed by injecting a dither signal to the quantizer of the front end of a CT MASH ADC. Other transfer functions (e.g., signal transfer function of $MOD_B$, referred to in FIG. 3 as $STF_2$) may also be estimated by injecting a dither signal. For simplicity, examples herein refer to injecting a dither signal for estimating a noise transfer function of the front end modulator. However, it is envisioned by the disclosure that dither injection can also be used to estimate other transfer functions of a signal path, e.g., the signal transfer function of the back end modulator or other transfer functions of a given stage in a multi-stage ADC.

Figure 4:
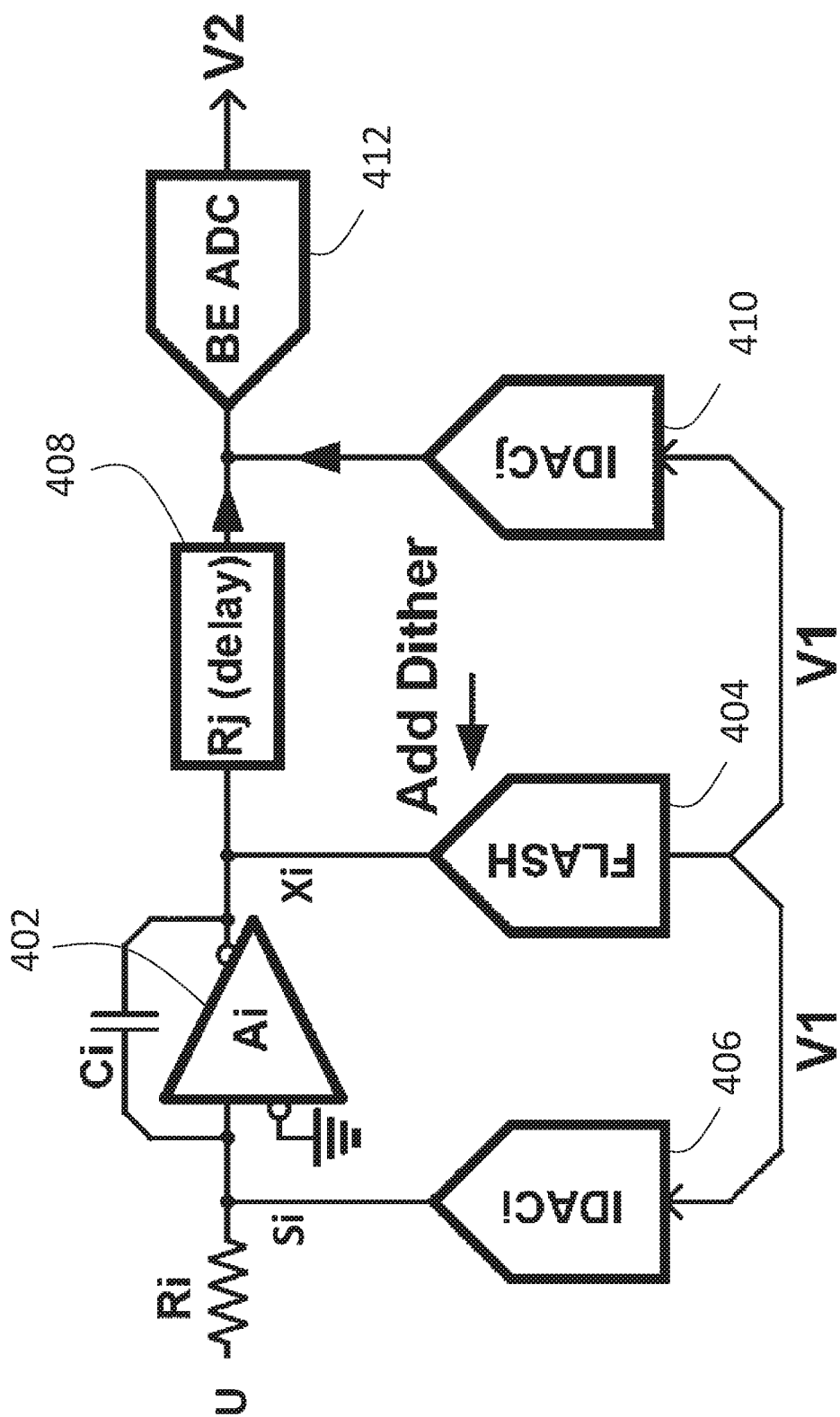
FIG. 4 illustrates dither injection to the quantizer inside the front-end of a CT MASH ADC.

FIG. 4 illustrates dither injection to the quantizer "FLASH" 402 inside the front end of a CT MASH ADC. FIG. 4 corresponds to and simplifies the illustration of FIG.

2. In the example shown in FIG. 4, the front end can receive a voltage input U, which is converted into a current by resistor "Ri" at node Si (representing an analog input to the modulator). The front end modulator has an integrator having opamp "Ai" 402 (similar to opamp 202 of FIG. 2) integrating the signal at node Si and generating output signal Xi. Xi is provided to flash quantizer "FLASH" 404 (similar to "FLASH1" 208 of FIG. 2) to be digitized. The modulator has a digital output signal V1 at the output "FLASH" 404. A feedback DAC "IDACi" 406 (similar to "DAC1" 214 of FIG. 2) receives the digital output signal V1 and generates an analog output signal to be fed back to node Si, i.e., the analog input to the modulator. A delay element "Rj" 408 (similar to delay element 212 of FIG. 2) delays the signal at Xi. The difference between Xi (or a delayed version of Xi at the output of the delay block 408) and the DAC "IDACj" 410 (similar to "DAC2A" 210 of FIG. 2) analog output yields the residue of the coarse quantization (i.e., of "FLASH" 404). The residue of the coarse quantization is digitized by the back end modulator, represented by "BE ADC" 412. The delay element 408 can be provided match possible transconductance and group delay of a signal path used for generating the "IDACj" 410 analog output, i.e., the path through "FLASH" 404 and "IDACj" 410. The digital output V1 of the front end modulator $MOD_A$ and the digital output V2 of the back end modulator $MOD_B$ are properly combined in digital domain as the final digital word of the 1-2 CT MASH ADC.

By injecting a dither signal into the flash quantizer "FLASH" 402 inside $MOD_A$, it is possible to extract or determine an estimate the noise transfer function of $MOD_A$. The timing difference between this dither signal being injected and the quantization noise of the flash quantizer "FLASH" 402 is preferably minimized, since any timing difference can add phase error to the measured NTF and causes noise leakage into the final output. The degree of degradation that can be tolerated can depend on the targeted MASH ADC noise floor as well as relative timing differences. The following passages describes various dither injection techniques which are not ideal.

Figure 5:
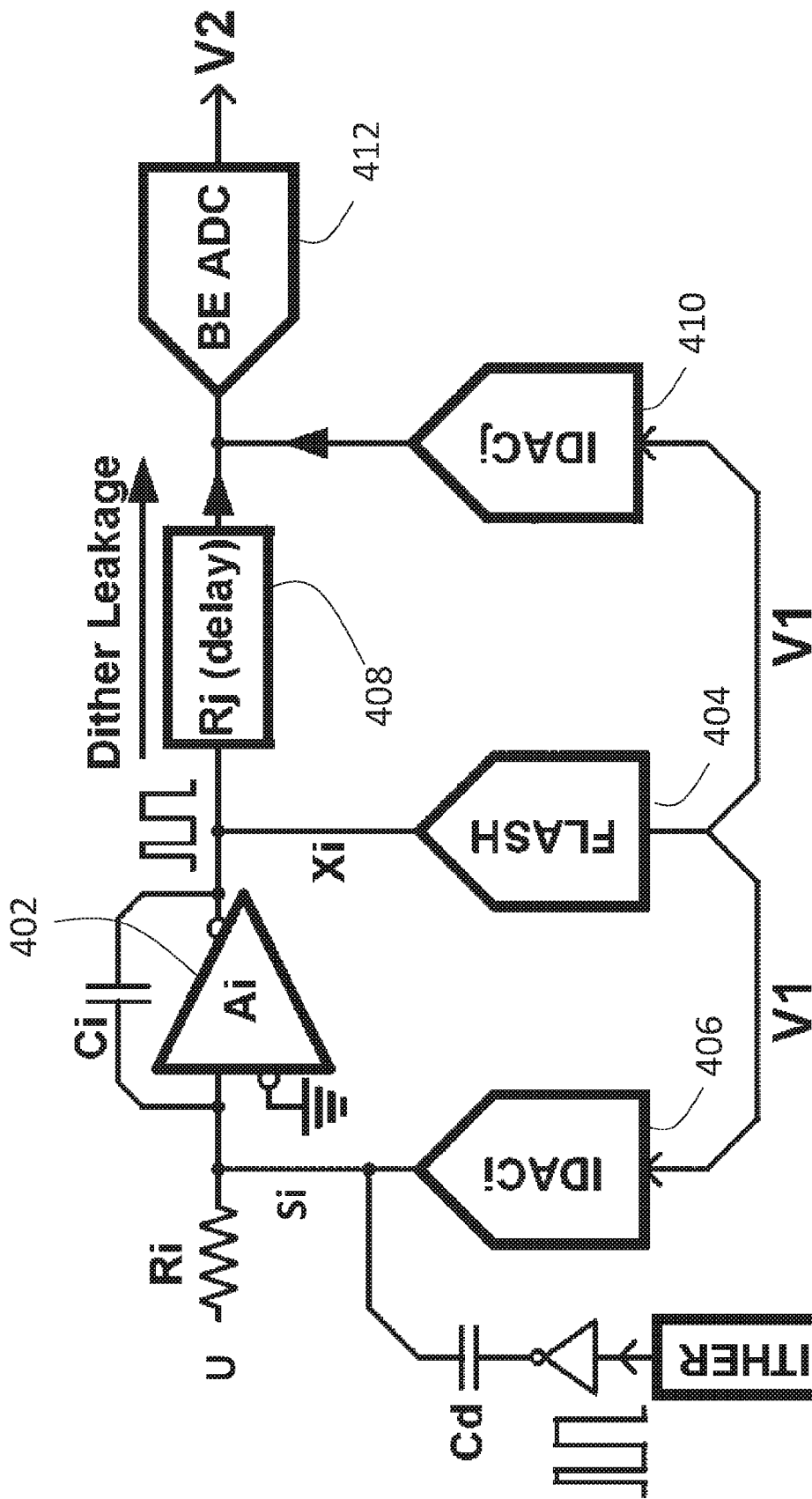
FIG. 5 illustrates one possible dither injection technique using a capacitive digital-to-analog converter (CAP-DAC) which suffers from dither leakage.
Figure 6:
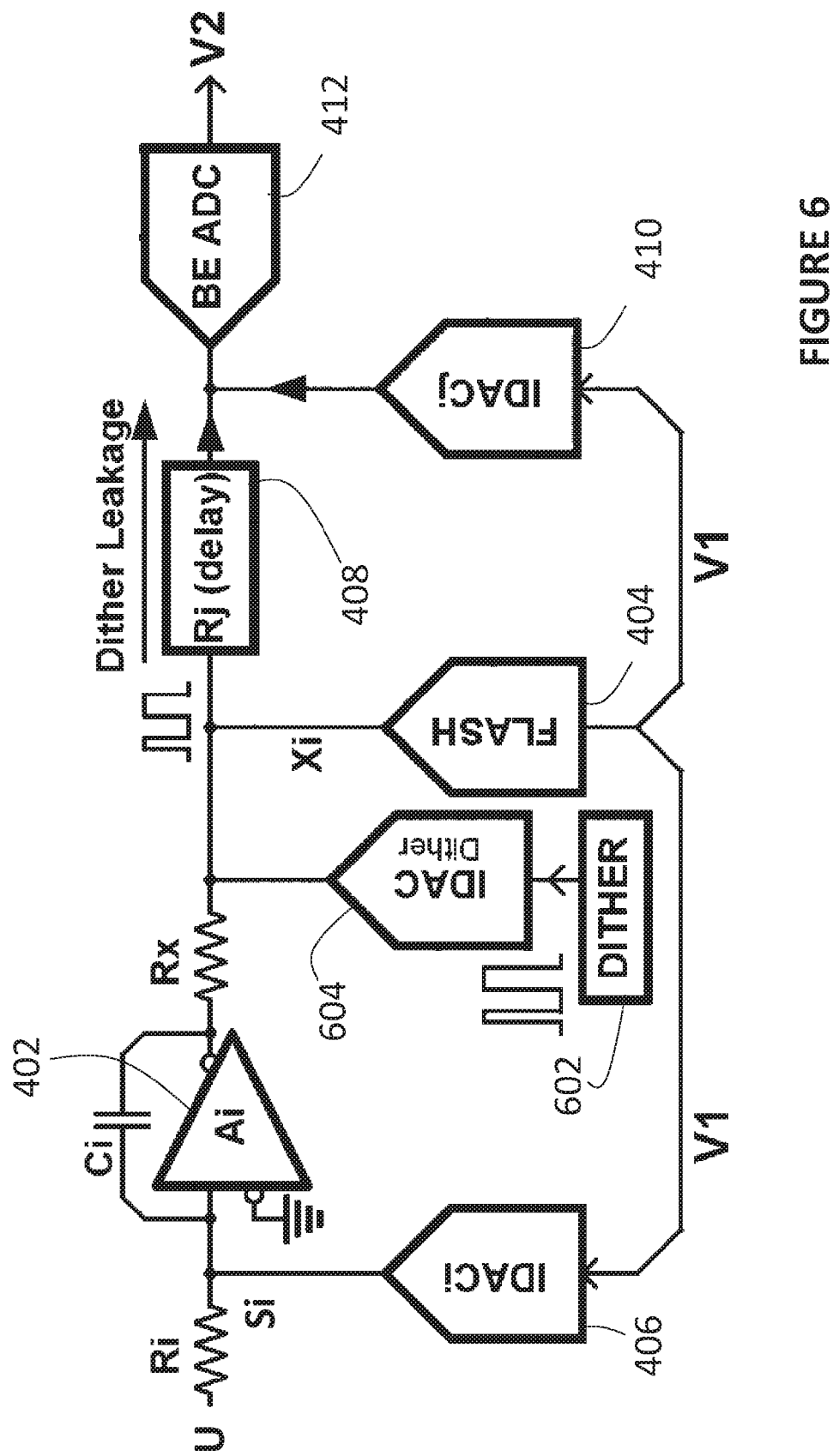
FIG. 6 illustrates another possible dither injection technique using a current-steering digital-to-analog converter which suffers from dither leakage.

In a single-loop (not MASH) CT DS ADC, a dither signal can be added to the flash quantizer by adding a voltage (proportional to the dither signal) to the input voltage of the flash quantizer. In one example illustrated by FIG. 5, dither injection can be done by using a capacitive digital-to-analog converter (CAP-DAC) tied to the summing node Si of the integrator (having opamp 402) driving the flash quantizer 404. A dither generator 502 can generate a dither signal for driving the CAP-DAC, which is represented by the capacitor Cd. The CAP-DAC can output the voltage based on the dither signal to the summing node Si. In another example illustrated by FIG. 6, dither injection can be done using a current-steering DAC 604 if there is a series resistor Rx in front or at the input of the flash quantizer 404. The dither generator 602 can generate a dither signal for driving the current-steering DAC 604, whose output is coupled to the node Xi. Unfortunately, these techniques usable for single-loop CT DS ADCs do not work for the flash quantizer 404 inside a CT MASH ADC where its quantization noise is being sensed. The reason is that the analog input voltage to the flash quantizer 404 in the front end of a MASH ADC is also injected into the back-end (represented by BE ADC 412), thereby causing dither leakage. Thus, the dither voltage signal being injected in the schemes illustrated by FIGS. 5 and 6 behaves like an additional noise that will be digitized by the back-end, and added to the final output. This raises the quantization noise of the MASH ADC. This issue is more severe in a low oversampling ratio (OSR) case where the NTF of the front-end is weak.

Figure 7:
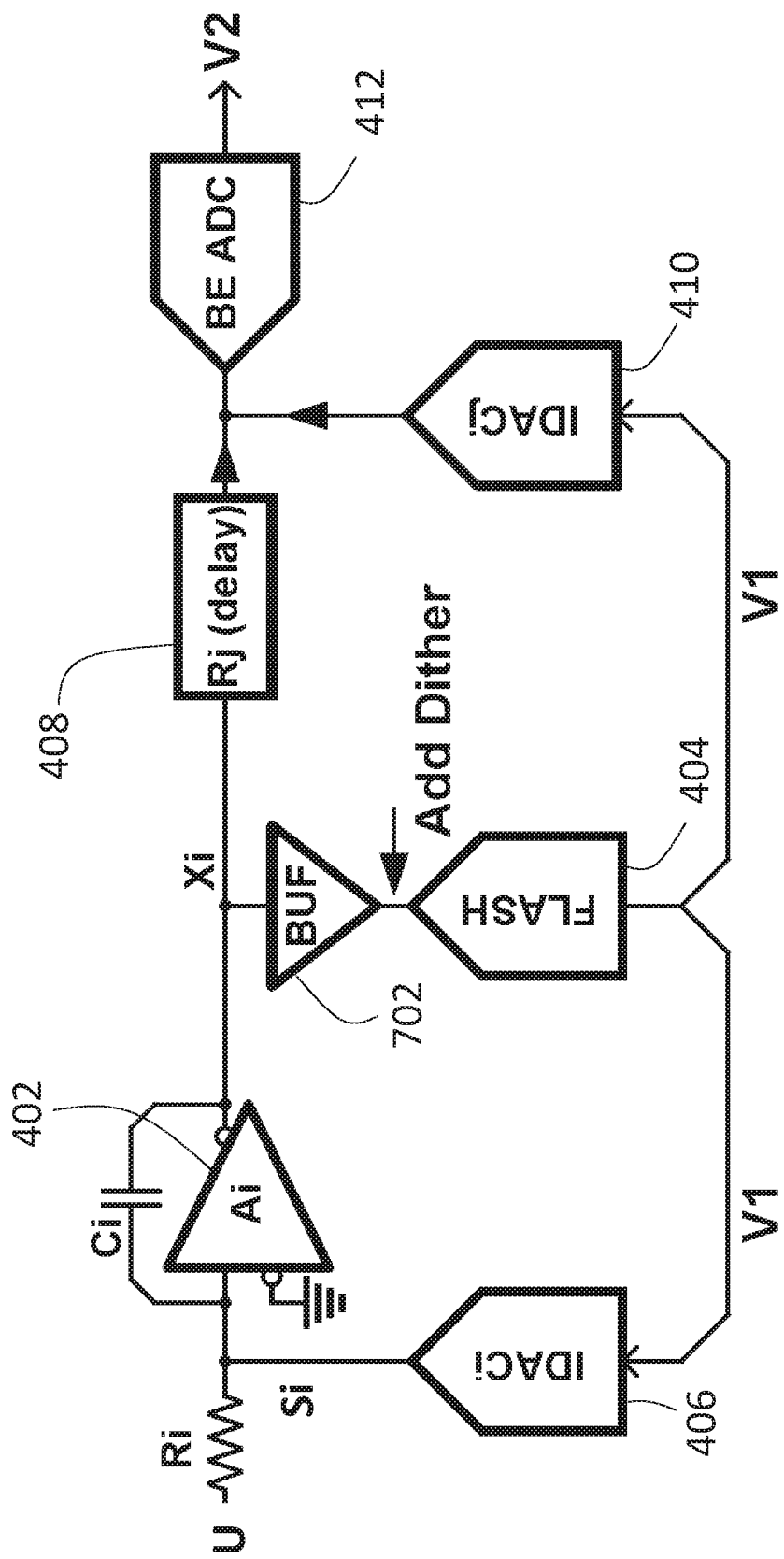
FIG. 7 illustrates yet another possible dither injection technique using an active buffer, which consumes a lot of power for certain applications.

In low-speed applications, it is possible to insert an active buffer 702 in front of (i.e., at the input of) the flash quantizer and add the dither signal after the buffer 702 (at the output of buffer 702), as illustrated by FIG. 7. The analog signal injected to the back-end (represented by BE ADC 412) would be the voltage before the buffer 702 (at the input of the buffer 702). However, this technique is difficult to be used in a high-speed low-OSR application where a low-noise, high-speed, moderate-gain buffer would consume significant power.

An Improved Dither Injection Technique

Figure 8:
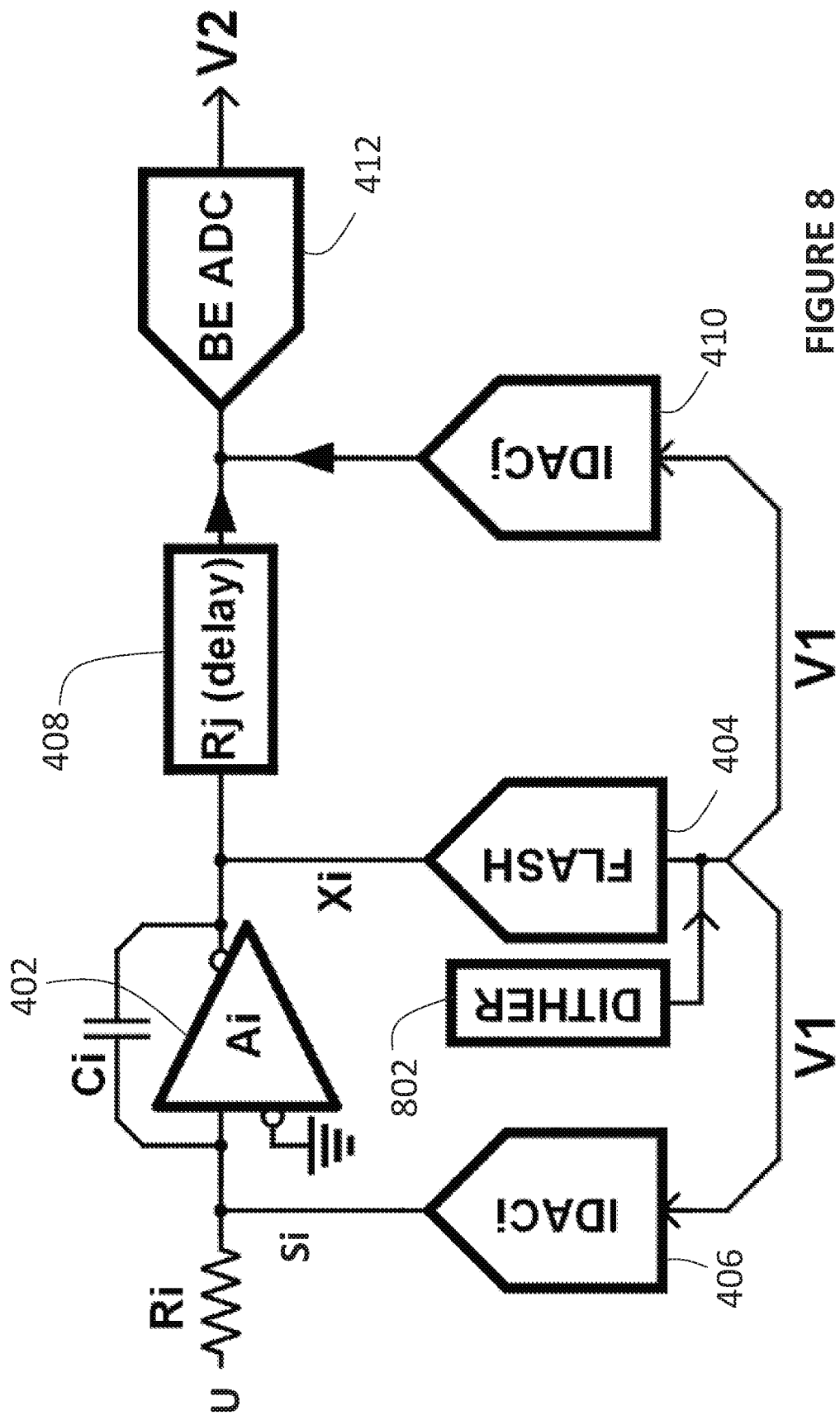
FIG. 8 illustrates an improved dither injection technique which injects the dither at the output of the quantizer, according to some embodiments of the disclosure.

FIG. 8 illustrates an improved dither injection technique which injects the dither at the output of the quantizer 404, according to some embodiments of the disclosure. In a high-speed CT MASH ADC, it is possible to add dither to the flash quantizer 404 (shown as "flash") at front end by adding the dither signal at the flash quantizer 404 output (denoted as V1, i.e., the digital output of the front end at the flash quantizer 404). This technique is in contrast to the other techniques shown in FIGS. 5-7. As seen in FIG. 8, the dither signal (e.g., a pseudo-random signal, randomized digital bit stream) generated or provided by dither generator 802 adds the dither signal as a digital bit stream to the regular flash quantizer 404 output stream V1. In a high speed CT DS ADC, there is no digital adder involved, the dither bit can drive DAC elements of the feedback DAC "IDACi" 406 like other flash output bits of V1. There is no complication on the Xi nodes with this scheme.

One objective for post-flash dither injection is how to make sure the dither signal experience the same transfer function as the quantization noise. For high speed applications, this means the dither signal timing may need to be synchronized with the flash quantizer 402, i.e., the quantization noise. In some embodiments, the dither bit stream can be generated using a logic block or circuitry (referred herein as a dither generator), which could be a clocked pseudo random binary sequence (PBRS) generator. However, the logic delay of the dither block or dither generator could potentially be different from that of the flash quantizer (e.g., flash quantizer 402 as seen in the FIGURES). The timing difference is especially more significant in cases where process, supply and temperature variations are considered. The timing difference between the dither bit stream and the regular flash quantizer output bit stream could potentially cause dither leakage if there is un-clocked DAC utilized in the MASH ADC system (like a CAP-DAC for example).

Figure 9:
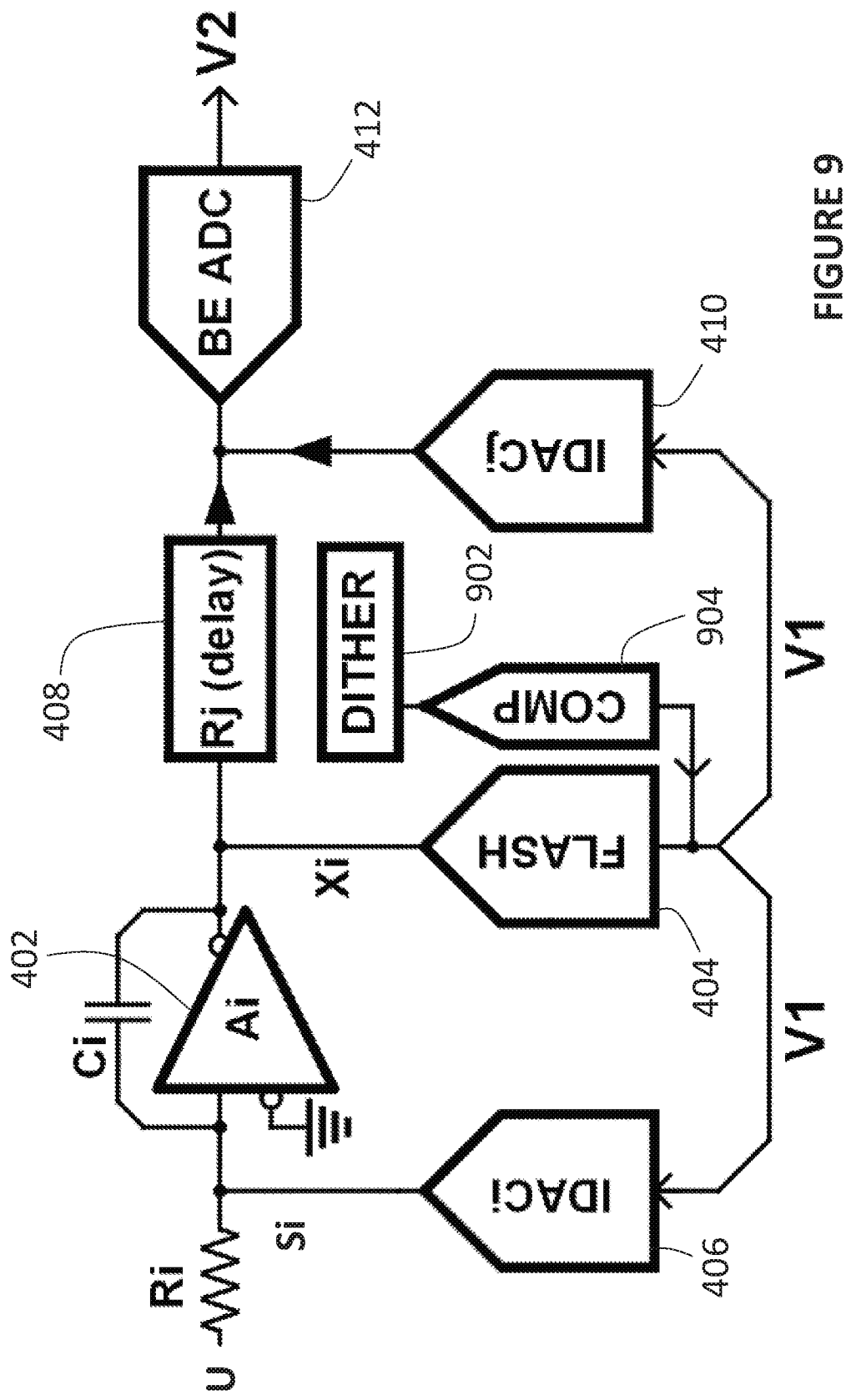
FIG. 9 illustrates dither injection using a dummy comparator, according to some embodiments of the disclosure.

Using a comparator slice, e.g., a dummy comparator, to re-sample the dither signal can solve the timing issue, especially over different operating conditions. FIG. 9 illustrates dither injection using a dummy comparator 902, according to some embodiments of the disclosure. Similar to the scheme illustrated in FIG. 8, the dither signal is injected at the output of the quantizer 404. One could use an identical comparator slice 904 to sample the dither bit generated by the dither generator 902 first and then use its own output (output of the comparator slice 904) as the post-flash quantizer dither bit stream. The comparator slice 904 is assumed to be the same or corresponds to the comparator slices in the quantizer 404. As the same comparator slices are used inside the flash quantizer as the dummy comparator slice 904, the timing behavior between the flash quantizer 404 outputs and dither bits at the output of the dummy comparator 904 are guaranteed.

In some cases, when the comparators inside the flash quantizer 404 has clocked data latches, it is possible to simplify the extra comparator slice 904 for the dither signal into (or replace the comparator slice 904 with) a clocked data latch that is identical to the clocked data latches of the flash quantizer. The digital signal generated by the dither generator 902 can be fed to the dummy clocked data latch alongside clocked data latches in the flash quantizer 404. Accordingly, the timing of the dither signal can be matched with the timing of the flash quantizer 404. Any logic circuits, such as buffers after the clocked latch, can be duplicated as well. Having an identical clocked data latch and following logic buffers, etc., could guarantee the dither timing to be identical to regular flash quantizer 404 outputs. The dither signal can be a 1-bit random signal or bit stream, or a multi-bit random signal or bit stream.

Method for Dither Injection

Figure 10:
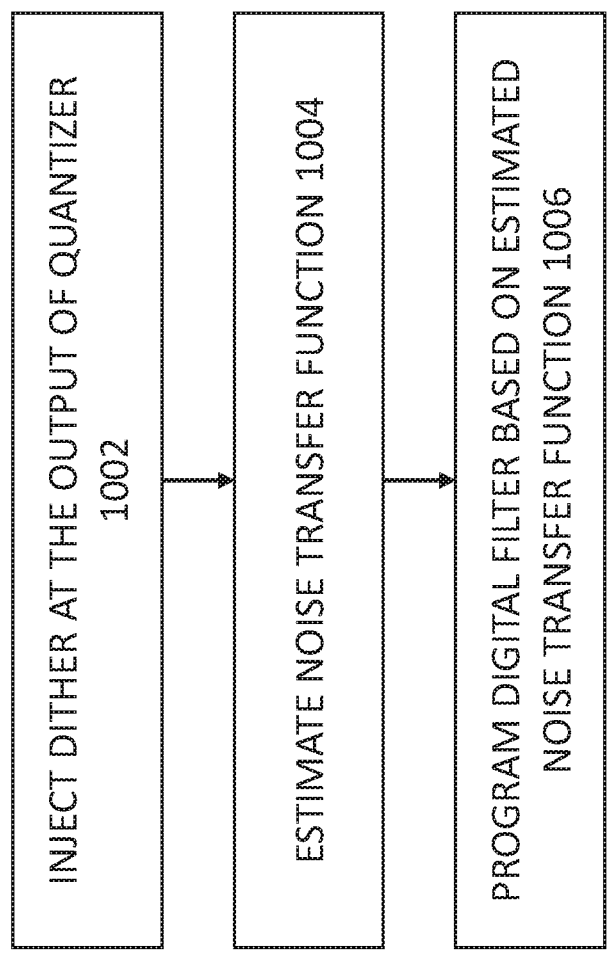
FIG. 10 is a flow diagram illustrating a method for dither injection to estimate a transfer function, according to some embodiments of the disclosure.

FIG. 10 is a flow diagram illustrating a method for dither injection to estimate a transfer function, according to some embodiments of the disclosure. In 1002, a dither signal is injected at the output of the quantizer. The quantizer can be the flash quantizer or other suitable (coarse) ADC of a front-end or stage of a continuous time multi-stage noise shaping ADC, e.g., quantizer 404 of FIGS. 8-9 and 11. In some embodiments, replica or dummy comparator(s) are used to resample the dither signal to guarantee timing of the dither signal with respect to the quantizer. One or more replica (logic) circuits, e.g., comparators, clocked data latches (clocked latching circuit), or buffers, etc., can be included to guarantee the dither timing to be identical to the regular flash quantizer output, and accordingly, help prevent dither leakage to the back end of the CT MASH ADC. In one example, the dither is added with re-sampling using replica comparator(s). In another example, the dither is added with re-sampling using replica clocked latching circuit inside a comparator (when the comparator in the quantizer has built-in clocked data latches).

In some embodiments, the method includes generating a dither bit stream by a dither generator. To guarantee sampling, re-sampling or sampling of the dither bit stream can be done by a replica circuit to generate the dither signal being injected to the output of the quantizer, wherein the replica circuit replicates a circuit in the quantizer to substantially match timing of the dither signal with an output signal of the quantizer. The replica circuit can match the circuitry in the quantizer by design (e.g., by replicating the same circuit in silicon, placing the replica circuit in the same area as the quantizer). The replica circuitry can be clocked by the same clock signals as the quantizer. In some cases, sampling the dither bit stream is done by a replica comparator which replicates a comparator in the quantizer. In some cases, sampling the dither bit stream is done by a replica clocked data latch which replicates a clocked data latch in the quantizer. In some cases, sampling the dither bit stream is done by a replica clocked data latch and a replica logic buffer which replicate a clocked data latch and a logic buffer in the quantizer. Broadly speaking, the sampling circuit can include one of more of the following for replicating circuitry in the quantizer: a comparator, a clocked data latch, and a logic buffer.

The scheme can be used to estimate the noise transfer function of the front end, e.g., by performing cross-correlation. In 1004, the noise transfer function of the front end can be estimated by cross-correlation. It is envisioned by the disclosure that other transfer functions can be estimated using the disclosed dither injection technique. For instance, the scheme can be used to estimate the signal transfer function of the back end by cross-correlation.

In 1006, a digital filter can be programmed based on the estimated noise transfer function, e.g., for purposes of quantization noise cancellation. The digital filter, e.g., $DNTF_1$ 308, can filter the digital output of a back end (e.g., second stage) of the MASH ADC. The back end processes the quantization noise (e.g., $q_1$) introduce by the quantizer. Another digital filter can be programmed based on the estimate signal transfer function, e.g., for purposes of quantization noise cancellation. The digital filter, e.g., $DSTF_2$ 308, can filter the digital output of the front end (e.g., first stage) of the MASH ADC.

Exemplary MASH ADC

Figure 11:
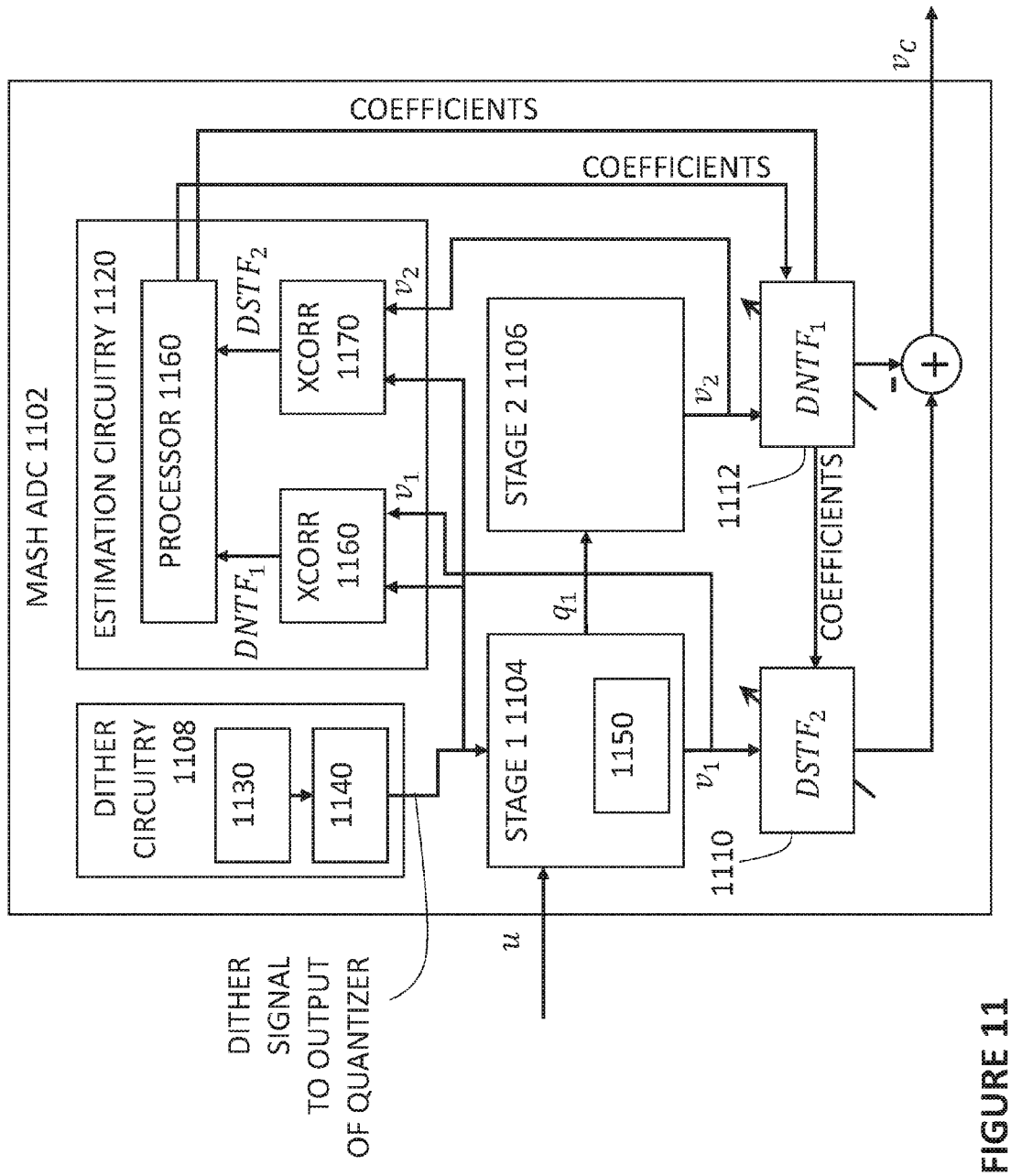
FIG. 11 shows a multi-stage noise shaping analog to digital converter having dither injection, according to some embodiments of the disclosure.

FIG. 11 shows a multi-stage noise shaping analog to digital converter having dither injection, according to some embodiments of the disclosure. The MASH ADC 1102 has a first stage 1104 (e.g., front end, $MOD_A$), which has a quantizer and a feedback DAC. The quantizer is described herein with respect to ADC1 302 of FIG. 3, flash quantizer 404 of FIGS. 4, 8 and 9. The feedback DAC is described herein with respect to "IDACi" 406 of FIGS. 4, 8 and 9. The MASH ADC has a second stage 1106 (e.g., back end, $MOD_B$) subsequent to the first stage 1104 to process or digitize a quantization noise of the quantizer (e.g., $q_1$). The MASH ADC 1102 preferably has digital quantization noise cancellation implemented, which involves providing digital filters $DSTF_2$ 1110 and $DNTF_1$ 1112 for filtering the digital output V1 of the first stage 1104 and the digital output V2 of the second stage 1106 respectively. The digital filters $DSTF_2$ 1110 and $DNTF_1$ 1112 can correspond to $DSTF_2$ 302 and $DNTF_1$ 308 of FIG. 3. The digital filters $DSTF_2$ 1110 and $DNTF_1$ 1112 aims to match the actual signal transfer function of the second stage 1106 and the actual noise transfer function of the first stage 1104 respectively.

The MASH ADC 1102 includes dither circuitry 1108 to generate a dither signal, wherein the dither signal drives an input of the feedback DAC receiving the dither signal and an output of the quantizer. Effectively, the dither signal is injected at the output of the feedback DAC in the first stage. The dither signal injected is used by estimation circuitry 1120 to, e.g., determine a noise transfer function of the first stage 1104, and/or determine a signal transfer function of the second stage 1106. In some embodiments, the estimation circuitry 1120 determines coefficients for the digital filter $DNTF_1$ 1112, which filters the digital output V2 of the second stage 1106. In some embodiments, the estimation circuitry 1120 determines coefficients for the digital filter $DSTF_2$ 1110, which filters the digital output V1 of the first stage 1104.

Estimation circuitry 1120 can include cross-correlation block 1160, which receives the dither signal and the digital output V1 of the first stage 1104. The cross-correlation of the dither signal and the digital output V1 of the first stage 1104 can estimate the noise transfer function of the first stage ($NTF_1$). Estimation circuitry 1120 can include cross-correlation block 1170, which receives the dither signal and the digital output V2 of the second stage 1106. The cross-correlation of the dither signal and the digital output V2 of the second stage 1106 can estimate the signal transfer function of the second stage ($STF_2$). The cross-correlation(s) can be provided to processor 1160 (or any suitable processing logic or circuitry) for further processing. For instance, the processor 1160 can determine coefficients which can be written to the digital filters $DSTF_2$ 1110 and $DNTF_1$ 1112. The processor 1160 can be an on-chip microprocessor provided on the same die as the MASH ADC, configured to execute instructions store in a memory for carrying out operations associated with the (post) processing of the cross-correlations. In some cases, the processor 1160 can perform the cross-correlations corresponding to the cross-correlation blocks 1160 and 1170 as well. As used herein, cross-correlation relates to a sliding dot product or sliding inner-product of two sequences of samples. In this case, the two sequences of samples can include a sequence having samples of the dither signal, and a sequence having samples of a digital output of a stage (e.g., V1, V2, etc.) when the dither signal is injected.

In some embodiments, the dither circuitry 1108 comprises a clocked pseudo random binary sequence generator which substantially matches timing of the dither signal with an output signal of the quantizer in the first stage 1104. In particularly, the clocking of the pseudo random binary sequence generator is implemented to match the clocking of the quantizer of the first stage 1104.

In some embodiments, the dither circuitry 1108 includes a dither generator 1130 for generating a dither bit stream, and sampling circuitry 1104 which replicates clocked circuitry 1150 in the quantizer of the first stage 1104. In some cases, the sampling circuitry 1104 includes a comparator, e.g., a replica of a comparator in the quantizer of the first stage 1104. In some cases, the sampling circuitry 1104 includes a clocked data latch, e.g., a replica of a clocked data latch in the quantizer of the first stage 1104. In some cases, the sampling circuitry 1104 includes a clocked data latch and a logic buffer (buffering the output of the clocked data latch), e.g., a replica of a clocked data latch and a logic buffer in the quantizer of the first stage 1104.

Exemplary Method and Apparatus for Transfer Function Estimation

Figure 12:
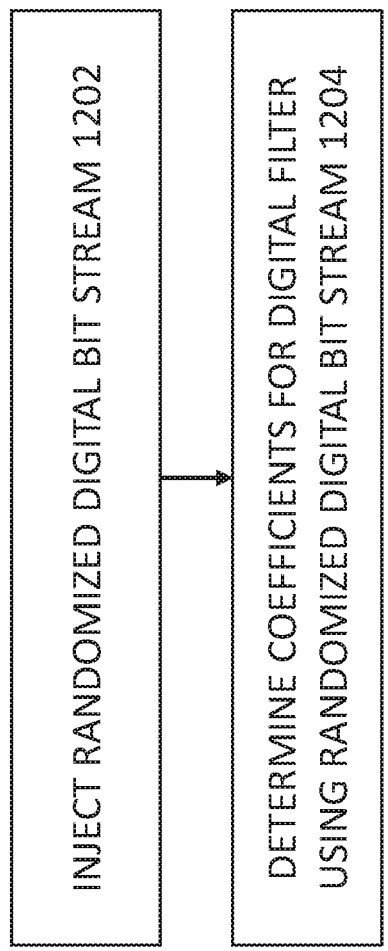
FIG. 12 is a flow diagram illustrating a method for transfer function estimation, according to some embodiments of the disclosure.

FIG. 12 is a flow diagram illustrating a method for transfer function estimation, according to some embodiments of the disclosure. Circuitry illustrated by FIGS. 8-9 and 12 can implement or carry out the method shown in FIG. 12. In 1202, a randomized digital bit stream, i.e., a dither signal, is injected to an output stream of a quantizer in a first stage of a multi-stage noise shaping analog to digital converter (MASH ADC). Injecting the digital bit stream comprises can include matching timing of the randomized digital bit stream with the output stream. In 1204, coefficients for a digital filter for filtering an output (e.g., of a first stage of the MASH ADC, of a second stage of the MASH ADC) can be determined using the randomized digital bit stream, e.g., by performing cross-correlation. In some embodiments, the digital filter filters a digital output of the first stage, and the digital filter matches a signal transfer function of a second stage subsequent to the first stage of the MASH ADC. In some embodiments, the digital filter filters a digital output of a second stage subsequent to the first stage of the MASH ADC, and the digital filter matches a noise transfer function of the first stage. The coefficients can be written to the digital filter to cancel quantization noise from the quantizer. The result is an effective and robust dither injection technique, which is suitable for estimating transfer functions in MASH ADCs or other multi-stage ADCs.

EXAMPLES

Example 1 is a method for transfer function estimation, the method comprising: injecting a dither signal at an output of a quantizer in a stage of a multi-stage noise shaping analog to digital converter (MASH ADC); estimating a transfer function of the stage; and programming a digital filter based on the estimated transfer function.

In Example 2, Example 1 can include the transfer function being a noise transfer function of the stage.

In Example 3, any one of the above Examples can include the transfer function being a signal transfer function of a further stage subsequent to the stage.

In Example 4, any one of the above Examples can include filtering, by the digital filter, a digital output of a further stage, wherein the further stage processes quantization noise introduced by the quantizer.

In Example 5, any one of the above Examples can include the digital filter cancelling quantization noise introduced by the quantizer.

In Example 6, any one of the above Examples can include estimating the transfer function comprising performing cross-correlation of the dither signal and a digital output of the MASH ADC.

In Example 7, any one of the above Examples can include generating a dither bit stream by a dither generator; and sampling the dither bit stream by a replica circuit to generate the dither signal, wherein the replica circuit replicates a circuit in the quantizer to substantially match timing of the dither signal with timing of an output signal of the quantizer.

In Example 8, any one of the above Examples can include the replica circuit replicating one or more of the following in the quantizer: a comparator, a clocked data latch, and a logic buffer.

Example 9 is a multi-stage noise shaping analog to digital converter (MASH ADC), the MASH ADC comprising: a first stage having a quantizer and a feedback digital to analog converter (DAC); a second stage to process a quantization noise of the quantizer; and dither circuitry to generate a dither signal, wherein the dither signal drives an input of the feedback DAC receiving the dither signal and an output of the quantizer.

In Example 10, any one of the above Examples can include estimation circuitry for estimating a noise transfer function of the first stage; and a digital filter for filtering a digital output of the second stage to cancel the quantization noise, the digital filter having coefficients determined by the estimation circuitry.

In Example 11, any one of the above Examples can include estimation circuitry for estimating a signal transfer function of the second stage; and a digital filter for filtering a digital output of the first stage to cancel the quantization noise, the digital filter having coefficients determined by the estimation circuitry.

In Example 12, any one of the above Examples can include the dither circuitry comprising a clocked pseudo random binary sequence generator which substantially matches timing of the dither signal with timing of an output signal of the quantizer.

In Example 13, any one of the above Examples can include the dither circuitry comprising: a dither generator for generating a dither bit stream; and sampling circuitry for sampling the dither bit stream to generate the dither signal, wherein the sampling circuitry replicates clocked circuitry in the quantizer.

In Example 14, any one of the above Examples can include the sampling circuit comprising one or more of: a comparator, a clocked data latch, and a logic buffer.

In Example 15, any one of the above Examples can include the first stage and the second stage being implemented with continuous time circuitry.

In Example 16, any one of the above Examples can include the first stage being a first order delta sigma modulator and the second stage being a second order delta sigma modulator.

Example 17 is an apparatus for transfer function estimation, the circuit comprising: means for injecting a randomized digital bit stream into an output stream of a quantizer in a first stage of a multi-stage noise shaping analog to digital converter (MASH ADC); and means for determining coefficients for a digital filter for filtering an output from the MASH ADC using the randomized digital bit stream.

In Example 18, any one of the above Examples can include means for injecting the randomized digital bit stream comprising means for matching timing of the randomized digital bit stream with timing of the output stream.

In Example 19, any one of the above Examples can include the digital filter filtering a digital output of the first stage of the MASH ADC; and the digital filter matching a signal transfer function of a second stage subsequent to the first stage of the MASH ADC.

In Example 20, any one of the above Examples can include the digital filter filtering a digital output of a second stage subsequent to the first stage of the MASH ADC; and the digital filter matching a noise transfer function of the first stage of the MASH ADC.

Other Implementation Notes, Variations, and Applications

The width of radio frequency (RF) bands commonly used for cellular telecommunications has grown from 35-75 MHz for 2G/3G/4G platforms to 100-200 MHz for today's Long Term Evolution (LTE) and the desire for relaxed image rejection filtering has pushed the direct intermediate frequency (IF) sampling frequencies to 300+MHz. In some embodiments, the dither injection techniques can be used in a continuous-time (CT) multi-stage noise-shaping (MASH) ADC integrated circuit which achieves 69 dB of DR over a 465 MHz signal bandwidth with a combined power consumption of 930 mW from ±1.0V/1.8V supplies. The ADC integrated circuit can be implemented in 28 nm CMOS and achieves a peak SNDR of 64 dB, a small-signal noise-spectral density (NSD) of −156 dBFS/Hz, and a figure-of-merit (FOM) of 156 dB over a signal bandwidth of 465 MHz. With an 8 GHz sample rate and a signal bandwidth of 465 MHz, the oversampling ratio (OSR) is 8.6. A 1-2 MASH architecture can be chosen to achieve aggressive noise-shaping at a low OSR. The use of low-order sub-loops also contributes to the robustness of the overall ADC. The first stage can be a first-order modulator to minimize the power of amplifiers for a given thermal noise requirement under a low OSR scenario. The first stage can include an active-RC integrator, a 17-level flash ADC (FLASH1), a current-steering DAC (IDAC1), and a capacitive-DAC (CDAC1). CDAC1 implements a fast direct-feedback (DFB) loop to compensate for the excess loop delay associated with the chosen FLASH-IDAC timing. A differential 200Ω R1U and a 625 uA IDAC1 LSB can set a 2V differential p-p input full-scale. A dither block adds a 1-bit ½-LSB dither signal to the output of FLASH1. The quantization residue of the first-stage is injected into the second-stage via R21 and current-steering DAC (IDAC2A). R21 is implemented as an all-pass RC lattice filter to provide both accurate transconductance and a group delay that approximately matches the delay through the FLASH1-IDAC2A path. The residue current is then digitized by the second-order second stage. The second stage consists of an active-RC resonator, a 17-level flash ADC (FLASH2), current steering DACs (IDAC2B and IDAC3), and a capacitive-DAC (CDAC2) used to provide a DFB loop. The second stage uses a feedback topology to minimize STF peaking and the input full-scale of the second stage is scaled down to provide an inter-stage gain of six to minimize the overall quantization noise floor while preventing the residue of the first stage from saturating the second stage. The digital outputs of both stages, V1 and V2, are fed to the digital backend for further processing. A 10-tap programmable FIR filter (DNCF) can implement digital quantization noise cancellation and equalization after decimation (DEC) by a factor of four. DNCF coefficients can be generated using an off-chip LMS algorithm during an integrated start-up calibration phase.

One important objective of the improved dither injection technique is to have a robust dither injection that can have accurate timing control that makes dither signal indistinguishable from the quantization noise of a flash quantizer inside a CT MASH ADC. While the embodiments described herein are described in relation to techniques for dither injection in a CT MASH ADC (the first stage and the second stage are implemented with continuous time circuitry (no switched capacitor circuits), the techniques can be applied to other architectures, such as a CT pipeline ADC. Furthermore, the techniques can be used for estimating the noise transfer function of any one of the stages of a MASH ADC, including continuous-time MASH ADCs (which uses continuous-time circuits), discrete-time MASH ADCs (which uses switched-capacitor circuits), or a hybrid continuous-time and discrete-time MASH ADC. While many examples are described as being used with a flash quantizer, the technique described herein is also applicable to other types of analog to digital converters or quantizers. While some examples herein relate to a 1-2 MASH ADC (the first stage is a $1^{st}$ order delta sigma modulator and the second stage is a second order delta sigma modulator), the dither injection technique is applicable to estimating transfer functions in MASH ADCs having different order modulators (e.g., a 2-2 MASH ADCs). While some examples herein relate to a two-stage ADCs, the dither injection technique is applicable to estimating transfer functions in ADCs having three or more stages.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

The present architecture for dither injection are particularly suitable for high speed, continuous-time, high precision applications where MASH ADCs are used. Applications which can greatly benefit from the architecture include: instrumentation, testing, spectral analyzers, military purposes, radar, wired or wireless communications, mobile telephones (especially because standards continue to push for higher speed communications), and base stations.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related dither injection, such as the processes shown in FIGS. 10 and 12, illustrate only some of the possible functions that may be executed by, or within, the circuits illustrated in FIGS. 4, 8, 9, and 11. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A method for transfer function estimation, the method comprising:
   injecting a dither signal at an output of a quantizer in a stage of a multi-stage noise shaping analog to digital converter (MASH ADC);
   estimating a signal transfer function of a further stage subsequent to the stage based on the dither signal; and
   programming a first digital filter based on the estimated signal transfer function.

2. The method of claim 1, further comprising:
   estimating a noise transfer function of the stage based on the dither signal; and
   programming a second digital filter based on estimated noise transfer function.

3. The method of claim 2, wherein estimating the noise transfer function comprises performing cross-correlation of the dither signal and a digital output of the stage.

4. The method of claim 2, further comprising:
   filtering, by the first digital filter, a digital output of the stage; and
   filtering, by the second digital filter, a digital output of the further stage, wherein the further stage processes quantization noise introduced by the quantizer.

5. The method of claim 2, wherein the first digital filter and the second digital filter cancel quantization noise introduced by the quantizer.

6. The method of claim 1, wherein estimating the signal transfer function comprises performing cross-correlation of the dither signal and a digital output of the further stage.

7. The method of claim 1, further comprising:
   generating a dither bit stream by a dither generator; and
   sampling the dither bit stream by a replica circuit to generate the dither signal, wherein the replica circuit replicates a circuit in the quantizer to substantially match timing of the dither signal with timing of an output signal of the quantizer.

8. The method of claim 7, wherein the replica circuit replicates one or more of the following in the quantizer: a comparator, a clocked data latch, and a logic buffer.

9. A multi-stage noise shaping analog to digital converter (MASH ADC), the MASH ADC comprising:
   a first stage having a quantizer and a feedback digital to analog converter (DAC);

a second stage to process a quantization noise of the quantizer;

dither circuitry to generate a dither signal, wherein the dither signal drives an input of the feedback DAC receiving the dither signal and an output of the quantizer;

first estimation circuitry for estimating a signal transfer function of the second stage based on the dither signal; and a first digital filter for filtering a digital output of the first stage to cancel the quantization noise, the first digital filter having coefficients determined by the first estimation circuitry.

10. The MASH ADC claim 9, further comprising:

second estimation circuitry for estimating a noise transfer function of the first stage; and a second digital filter for filtering a digital output of the second stage to cancel the quantization noise, the second digital filter having coefficients determined by the second estimation circuitry.

11. The MASH ADC claim 9, wherein the first estimation circuitry comprises a correlation block receiving the dither signal and a digital output of the second stage.

12. The MASH ADC of claim 9, wherein the dither circuitry comprises a clocked pseudo random binary sequence generator which substantially matches timing of the dither signal with timing of an output signal of the quantizer.

13. The MASH ADC of claim 9, wherein the dither circuitry comprises:

a dither generator for generating a dither bit stream; and sampling circuitry for sampling the dither bit stream to generate the dither signal, wherein the sampling circuitry replicates clocked circuitry in the quantizer.

14. The MASH ADC of claim 13, wherein the sampling circuitry comprises one or more of: a comparator, a clocked data latch, and a logic buffer.

15. The MASH ADC of claim 9, wherein the first stage and the second stage are implemented with continuous time circuitry.

16. The MASH ADC of claim 9, wherein the first stage is a first order delta sigma modulator and the second stage is a second order delta sigma modulator.

17. An apparatus for transfer function estimation, the apparatus comprising:

means for injecting a randomized digital bit stream into an output stream of a quantizer in a first stage of a multi-stage noise shaping analog to digital converter (MASH ADC); and means for determining coefficients for a first digital filter using the randomized digital bit stream, wherein the first digital filter filters a digital output of the first stage the MASH ADC and the first digital filter matches a signal transfer function of a second stage subsequent to the first stage of the MASH ADC.

18. The apparatus of claim 17, wherein means for injecting the randomized digital bit stream comprises means for matching timing of the randomized digital bit stream with timing of the output stream.

19. The apparatus of claim 17, further comprising:

means for determining coefficients for a second digital filter using the randomized digital bit stream, wherein the second digital filter filters a digital output of the second stage, and the second digital filter matches a noise transfer function of the first stage of the MASH ADC.

20. The apparatus of claim 19, wherein the first digital filter and the second digital filter cancel quantization noise introduced by the quantizer.

* * * * *